(12) United States Patent
Okamura

(10) Patent No.: US 9,992,907 B2
(45) Date of Patent: Jun. 5, 2018

(54) POWER CONVERSION APPARATUS

(71) Applicant: DENSO CORPORATION, Kariya, Aichi-pref. (JP)

(72) Inventor: Makoto Okamura, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days. days.

(21) Appl. No.: 15/348,496

(22) Filed: Nov. 10, 2016

(65) Prior Publication Data
US 2017/0151878 A1    Jun. 1, 2017

(30) Foreign Application Priority Data
Nov. 30, 2015   (JP) ................... 2015-234098

(51) Int. Cl.
| | |
|---|---|
| H02M 1/00 | (2006.01) |
| H05K 7/20 | (2006.01) |
| B60L 11/08 | (2006.01) |
| B60L 11/18 | (2006.01) |
| H02M 3/158 | (2006.01) |
| H02M 1/14 | (2006.01) |
| H02M 1/44 | (2007.01) |
| H02M 3/335 | (2006.01) |

(52) U.S. Cl.
CPC ............. *H05K 7/20* (2013.01); *B60L 11/08* (2013.01); *B60L 11/1811* (2013.01); *B60L 2210/12* (2013.01); *B60L 2210/14* (2013.01); *B60L 2210/42* (2013.01); *H02M 1/14* (2013.01); *H02M 1/44* (2013.01); *H02M 3/158* (2013.01); *H02M 3/33584* (2013.01)

(58) Field of Classification Search
CPC .. H01R 13/6675; H01R 29/00; H01R 31/065; H02M 7/003; G09G 3/20; H01L 23/3107; H01L 23/32; H01L 31/0201; G06F 1/1601; G06F 1/1637; G06F 1/181; G06F 11/3044; G06F 2200/1631; H05K 2201/09754; H05K 2201/0999; H05K 5/006; H05K 1/11; H05K 1/182; H05K 1/111; H05K 1/112
See application file for complete search history.

(56) References Cited

U.S. PATENT DOCUMENTS

| | | | |
|---|---|---|---|
| 9,308,877 B2 * | 4/2016 | Shiba | ............... B60L 11/123 |
| 2012/0300522 A1 * | 11/2012 | Tokuyama | ........ H01L 25/072 363/131 |
| 2015/0029666 A1 | 1/2015 | Kosuga et al. | |

* cited by examiner

*Primary Examiner* — Nguyen Tran
(74) *Attorney, Agent, or Firm* — Oliff PLC

(57) ABSTRACT

In a power conversion apparatus, an inverter converts a DC voltage supplied from a battery into an AC voltage, and a DC-to-DC converter steps up or down the DC voltage. A case has an input terminal to which a power line from the battery is connected so as to input the DC voltage to the inverter, and a converter input terminal to which a power line to the DC-to-DC converter is connected so as to input the DC voltage to the DC-to-DC converter. The case has a reference wall and an opposed wall opposed to each other. The inverter input terminal is disposed adjacent to the reference wall with respect to an imaginary plane that bisects the case between the reference wall and the opposed wall. The converter input terminal is disposed adjacent to the opposed wall with respect to the imaginary plane.

12 Claims, 12 Drawing Sheets

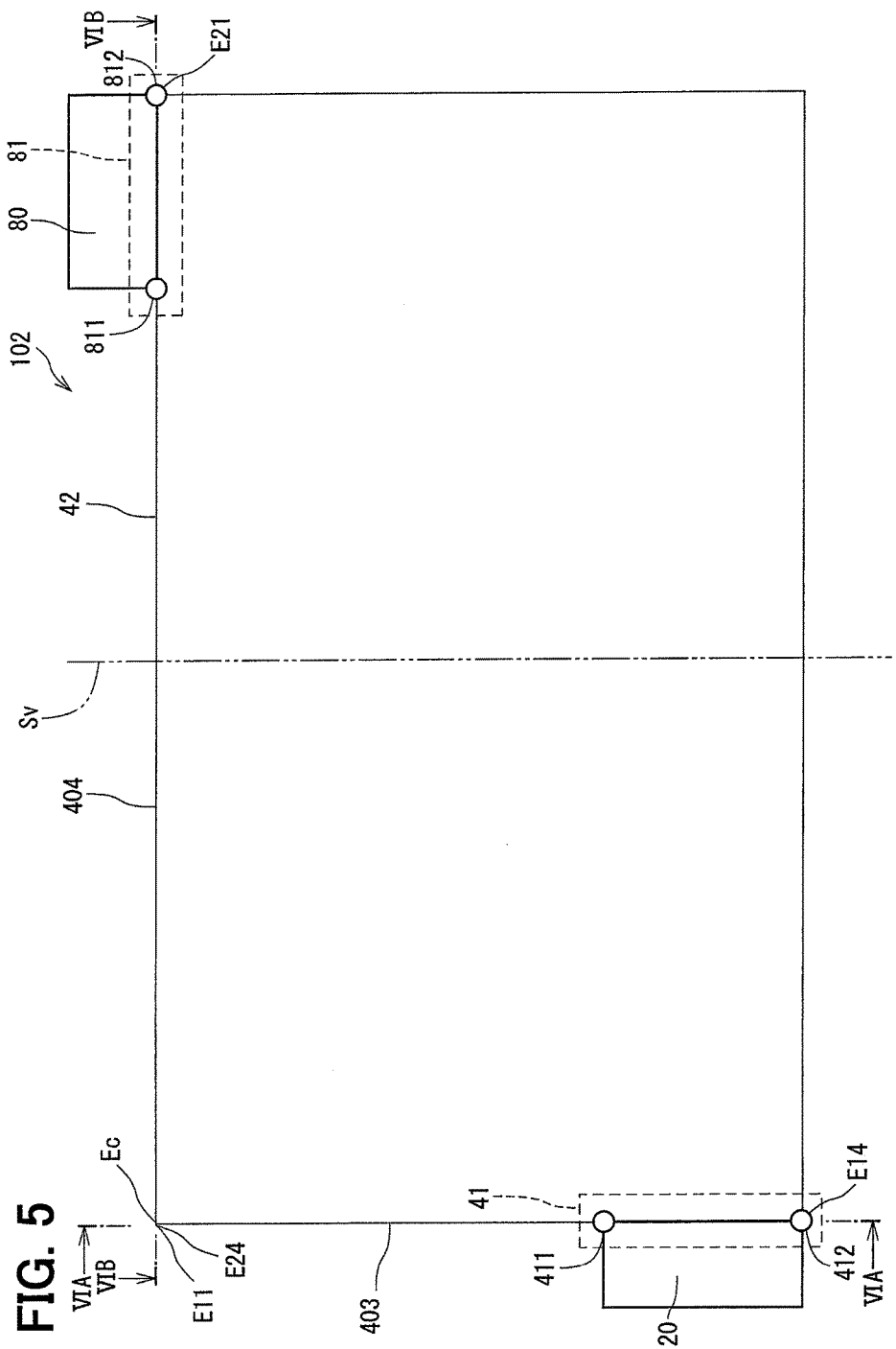

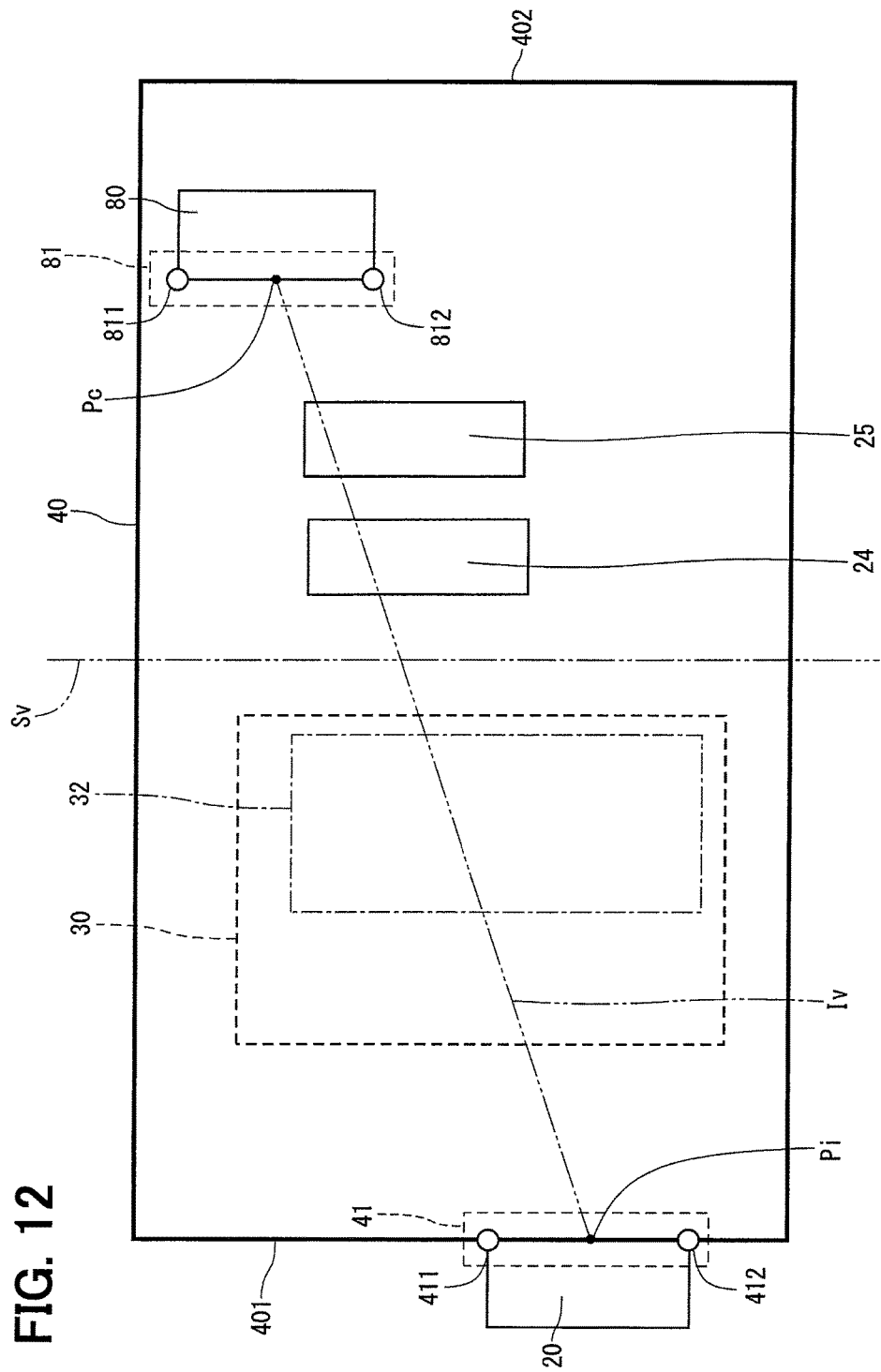

POWER CONVERSION APPARATUS

CROSS REFERENCE TO RELATED APPLICATION

This application is based on Japanese Patent Application No. 2015-234098 filed on Nov. 30, 2015, the disclosure of which is incorporated herein by reference.

TECHNICAL FIELD

The present disclosure relates to a power conversion apparatus.

BACKGROUND

Hybrid vehicles and electric vehicles have high-voltage batteries and power conversion apparatus. The high-voltage battery supplies electric power to the power conversion apparatus that drives a motor for driving a vehicle. The power conversion apparatus is provided with a DC-to-DC converter that converts a high voltage supplied from the high-voltage battery to a low voltage. The low voltage converted by the DC-to-DC converter is supplied to auxiliary devices of the vehicle, such as lamps and a radio.

JP 2013-211943 A, which corresponds to US 2015/0029666 A1, discloses a power conversion apparatus including a power semiconductor module and a DC-to-DC converter. The power semiconductor module converts a DC voltage into an AC voltage. The DC-to-DC converter converts a DC voltage to a DC voltage with a different level.

SUMMARY

Vehicle apparatus, such as the power conversion apparatus, need to be installed in a limited space in order to improve comfortability of a passenger compartment of a vehicle, and thus have been required to reduce the size thereof. JP 2013-211943 A has proposed to reduce the size of the power conversion apparatus by shortening a wiring connection distance from the power semiconductor module and the DC-to-DC converter to respective input terminals.

In order to further reduce the size of the power conversion apparatus, it is necessary to reduce the size of devices included in the power conversion apparatus, in addition to the shortening of the wiring connection distance. In order to reduce the size of the power conversion apparatus, it is considered to reduce the size of the DC-to-DC converter of the power conversion apparatus. In order to reduce the size of the DC-to-DC converter, development of higher frequency of the DC-to-DC converter is assumed.

Si-MOSFET (silicon-metal oxide semiconductor field effect transistor), which has been used in the DC-to-DC converter, is driven at a switching frequency of several hundreds kHz (kilohertz). However, a next generation semiconductor device having highly improved performance as compared with the Si semiconductor device, which is represented by SiC or GaN, spurs on making the DC-to-DC converter higher frequency. Although the higher frequency of the DC-to-DC converter has been developed, it is hampered due to degradation of radio noise.

Also at the switching frequency of the conventional DC-to-DC converter, noise mingles in the radio of the vehicle due to a harmonic component having a high frequency of a tertiary harmonic frequency or higher. As a cause of the radio noise, radiation noise caused by a common mode current flowing in a wire superimposes on a radio antenna, resulting in mixing of undesired noise in the radio.

It is concerned that a fundamental wave of the switching frequency has a value approximate to the radio frequency, when the frequency of the DC-to-DC converter is further increased so as to further reduce the size of the DC-to-DC converter, resulting in an increase in issue of the radio noise.

It is an object of the present disclosure to provide a power conversion apparatus that is capable of reducing the size of a DC-to-DC converter while suppressing a radio noise.

According to an aspect of the present disclosure, a power conversion apparatus includes an inverter, a DC-to-DC converter, and a case. The inverter converts a DC voltage supplied from a battery into an AC voltage. The DC-to-DC converter steps up or down the DC voltage supplied from the battery.

The case includes: a plurality of walls surrounding the inverter; an inverter input terminal to which a power line from the battery is connected so as to input the DC voltage to the inverter; and a converter input terminal to which a power line connecting to the DC-to-DC converter is connected so as to input the DC voltage to the DC-to-DC converter.

The plurality of walls includes a reference wall and an opposed wall that is opposed to the reference wall. The inverter input terminal is disposed adjacent to the reference wall with respect to an imaginary plane that bisects the case between the reference wall and the opposed wall. The converter input terminal is disposed adjacent to the opposed wall with respect to the imaginary plane.

Namely, the inverter input terminal and the converter input terminal are disposed on opposite sides with respect to the imaginary plane. In this configuration, since an impedance inside of the power converter apparatus increases, a radiation noise caused by a common mode noise can be suppressed.

Since the radiation noise is suppressed, the radio noise can be suppressed. Since the radio noise can be suppressed, the switching frequency of the DC-to-DC converter can be increased. Since the switching frequency of the DC-to-DC converter can be increased, the size of the DC-to-DC converter can be reduced.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which:

FIG. 5 is an explanatory top view of a case of a power conversion apparatus according to a second embodiment of the present disclosure for explaining arrangements of components;

FIG. 12 is an explanatory top view of a case of a power conversion apparatus according to another embodiment of the present disclosure.

DETAILED DESCRIPTION

Hereinafter, embodiments of the present disclosure will be described with reference to FIGS. 1 to 11.

In embodiments described subsequent to a first embodiment, components or structures that are substantially the same as those described in the first embodiment will be designated with the same reference numbers. Note that the phrase "the present embodiment" means the first to seventh embodiments.

The power conversion apparatus described hereinafter in the first to seventh embodiments is, for example, employed to a system that drives an inverter and a DC-to-DC converter for supplying electric power to auxiliary devices.

First Embodiment

Figure 1:
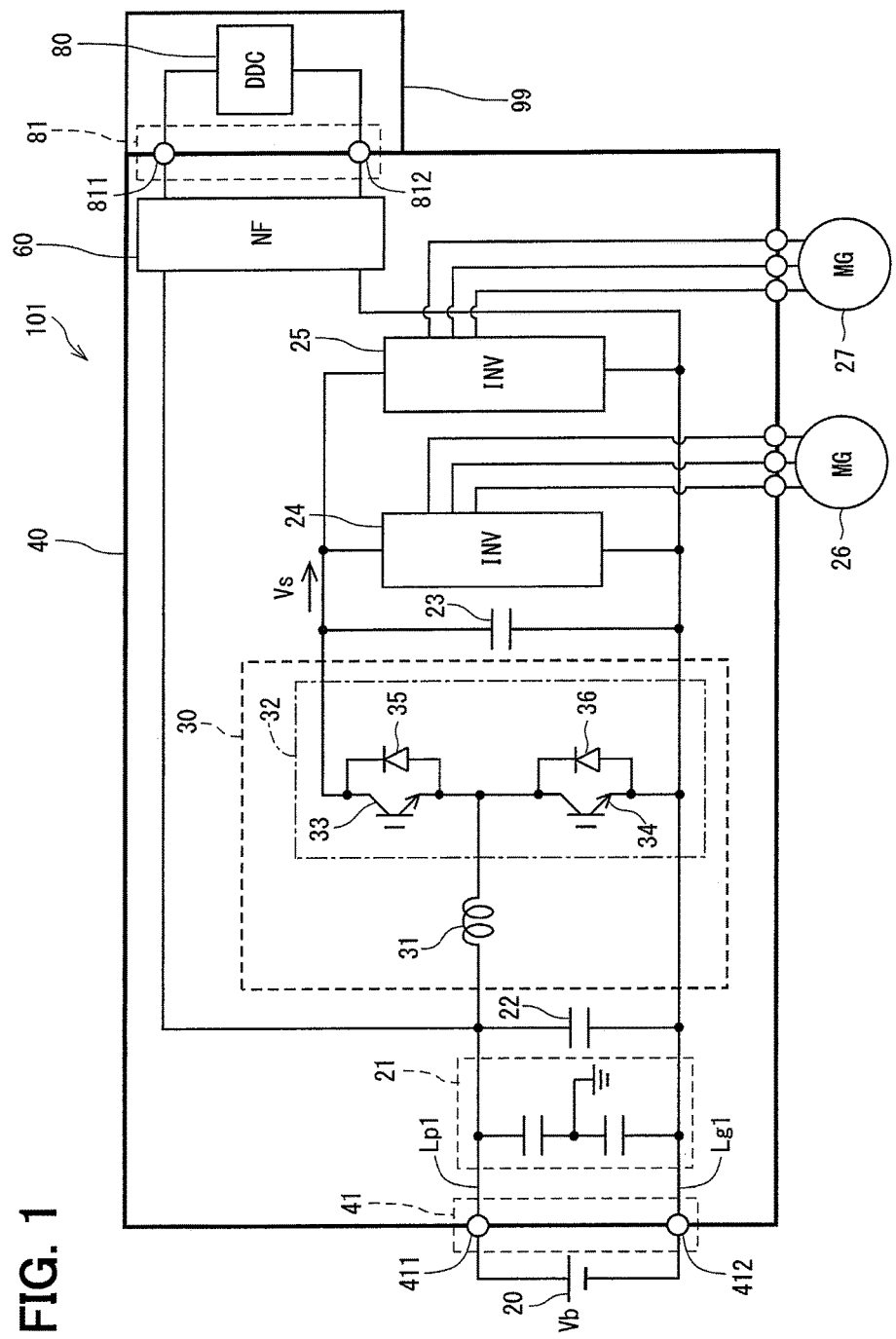
FIG. 1 is a block diagram of a driving system having a power conversion apparatus according to a first embodiment of the present disclosure.

A structure of a motor driving system including a power conversion apparatus 101 will be described with reference to FIG. 1. As shown in FIG. 1, the motor driving system includes motor generators 26, 27 and the power conversion apparatus 101.

The motor generators 26, 27 are permanent magnet synchronous-type three-phase AC motors. The motor generators 26, 27 are, for example, used in a series parallel hybrid system of a hybrid vehicle. The motor generators 26, 27 functions as electric motors that generate torques as being driven by electric power supplied from a battery 20, as well as functions as generators that generate electric power as being driven when the vehicle is damping.

The power conversion apparatus 101 includes the battery 20, a common mode capacitor 21, a filter capacitor 22, a boost converter 30, a smoothing capacitor 23, inverters 24, 25, a noise filter 60, a DC-to-DC converter 80 and a case 40. Hereinafter, the motor generator will be referred to as "MG", and the DC-to-DC converter will be referred to as "DDC". Also, in the drawings, the noise filter 60 is designated with "NF", and the inverters 24, 25 are designated with "INV".

The battery 20 is connected to an inverter input terminal 41 of the case 40. The battery 20 is a DC power source that is, for example, provided by a rechargeable battery, such as a nickel-hydrogen secondary battery and a lithium-ion secondary battery. In place of the battery 20, an electrical storage device, such as an electric double-layer capacitor, may be used as the DC power source. The voltage applied by the battery 20 will be referred to as a battery voltage Vb.

The common mode capacitor 21 is connected in parallel with the battery 20. The common mode capacitor 21 includes a series circuit of two capacitors. A junction point between the two capacitors is connected to a ground line. Thus, the common mode capacitor 21 is so-called a Y-capacitor. The common mode capacitor 21 draws a common mode current that is conducted through a high-potential line Lp1 and a low-potential line Lg1 from the battery 20 into the ground line, thereby to reduce common mode noise.

The filter capacitor 22 is connected in parallel with the battery 20, and is made of a single capacitor. Thus, the filter capacitor 22 is so-called an X-capacitor. The filter capacitor 22 functions to reduce a normal mode noise from the battery 20 as well as to smooth variations in the battery voltage Vb.

The boost converter 30 includes a reactor 31 and a boosting part 32. The boost converter 30 steps up the battery voltage Vb to generate a boosted voltage Vs. The boosted voltage Vs is provided to the inverters 24 and 25.

The reactor 31 can store and discharge an electric energy caused by an induced voltage, which is generated with a change in current.

The boosting part 32 includes two switching elements 33, 34, which are connected in series, and freewheel diodes 35, 36, which are correspondingly connected in parallel with the switching elements 33, 34.

The switching element 33, which is on a high potential side, is connected between an output terminal of the reactor 31 and the high-potential line Lp1 of the inverters 24, 25. The switching element 34, which is on a low potential side, is connected between the output terminal of the reactor 31 and the low-potential line Lg1 of the inverters 24, 25. The freewheel diodes 35, 36 are arranged in directions that allow electric currents from the low potential side to the high potential side.

During an operation, when the high potential side switching element 33 is in an off state and the low potential side switching element 34 is in an on state, the electric current flows from the battery 20 to the reactor 31, so the electric energy is stored in the reactor 31. When the high potential side switching element 33 is in an on state and the low potential side switching element 34 is in an off state, the electric energy stored in the reactor 31 is discharged, so the boosted voltage Vs, which is a voltage in which the induced voltage is superimposed on the battery voltage Vb, is output toward the inverters 24, 25.

The smoothing capacitor 23 is connected in parallel with the inverter 24, in between the boost converter 30 and the inverter 24. The smoothing capacitor 23 smoothes the variations in the boosted voltage Vs output to the inverters 24, 25.

The inverters 24 and 25 are each made of bridge-connected six switching elements, and applied with the boosted voltage Vs. In the inverters 24 and 25, the switching elements on each phase are turned on and off in accordance with a PWM control or a phase control. Thus, the inverters 24 and 25 convert the DC voltage into three-phase AC voltage and supply the three-phase AC voltages to the MGs 26 and 27 in accordance with the on and off control of the switching elements.

The noise filter 60 is disposed between a converter input terminal 81 and the inverter input terminal 41. The noise filter 60 is connected in parallel with the filter capacitor 22. The noise filter 60 suppresses the normal mode noise and the common mode noise.

Figure 2:
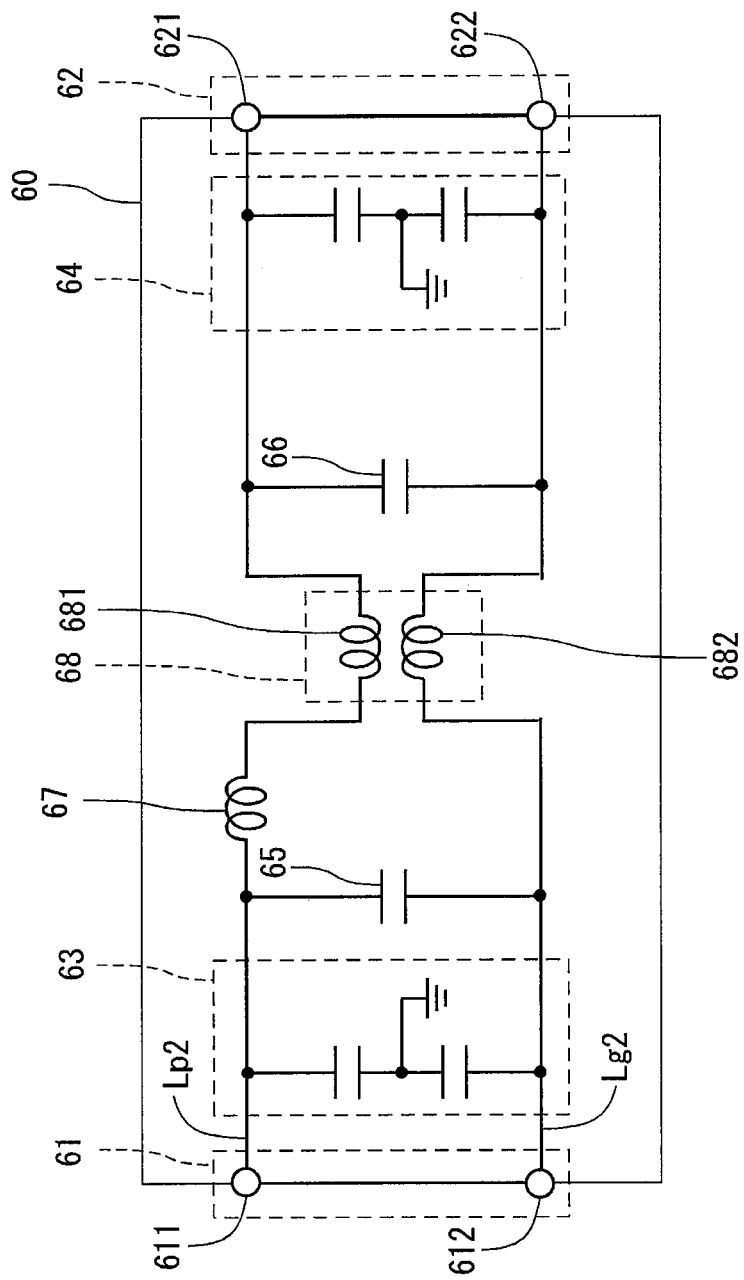
FIG. 2 is an equivalent circuit diagram of a noise filter of the power conversion apparatus according to the first embodiment.

As shown in FIG. 2, the noise filter 60 includes a filter input terminal 61, a filter output terminal 62, common mode capacitors 63, 64, line capacitors 65, 66, a normal mode choke coil 67 and a common mode choke coil 68.

The filter input terminal 61 includes a first filter input terminal 611, and a second filter input terminal 612. The filter output terminal 62 includes a first filter output terminal 621 and a second filter output terminal 622.

The common mode capacitors 63, 64 are Y-capacitors. The common mode capacitors 63, 64 draw the common mode current conducted through the high-potential line Lp2 and the low-potential line Lg2 to the ground line to thereby suppress the common mode noise.

The line capacitors 65, 66 suppress the normal mode noise that is conducted through the high-potential line Lp2 and the low-potential line Lg2.

The normal mode choke coil. 67 has a structure in which a single conducting wire is wound around a single core. The normal mode choke coil 67 is connected in series to and between the first filter input terminal 611 and the common mode choke coil 68. The normal mode choke coil 67 generates a magnetic flux when the normal mode current flows in the normal mode choke coil 67. When the magnetic flux is generated in the normal mode choke coil 67, the normal mode choke coil 67 functions as an inductor to thereby suppress the normal mode noise.

The common mode choke coil 68 includes a first coil 681 and a second coil 682. The common mode choke coil 68 has a structure in which two conducting wires are wound around a single core. The conducting wires of the first coil 681 and the second coil 682 are wound around the core in opposite directions to each other. When the common mode currents flow in the first coil 681 and the second coil 682, the magnetic fluxes generated in the first coil 681 and the second coil 682 are intensified to each other. Therefore, the common mode choke coil 68 functions as an inductor generating a large impedance to thereby suppress the common mode noise.

The DDC 80 is surrounded by a cover 99, and is connected to the converter input terminal 81 of the case 40. The DDC 80 steps down the battery voltage Vb that is applied from the battery 20 through the inverter input terminal 41 to generate a bucked voltage Vd.

Figure 3:
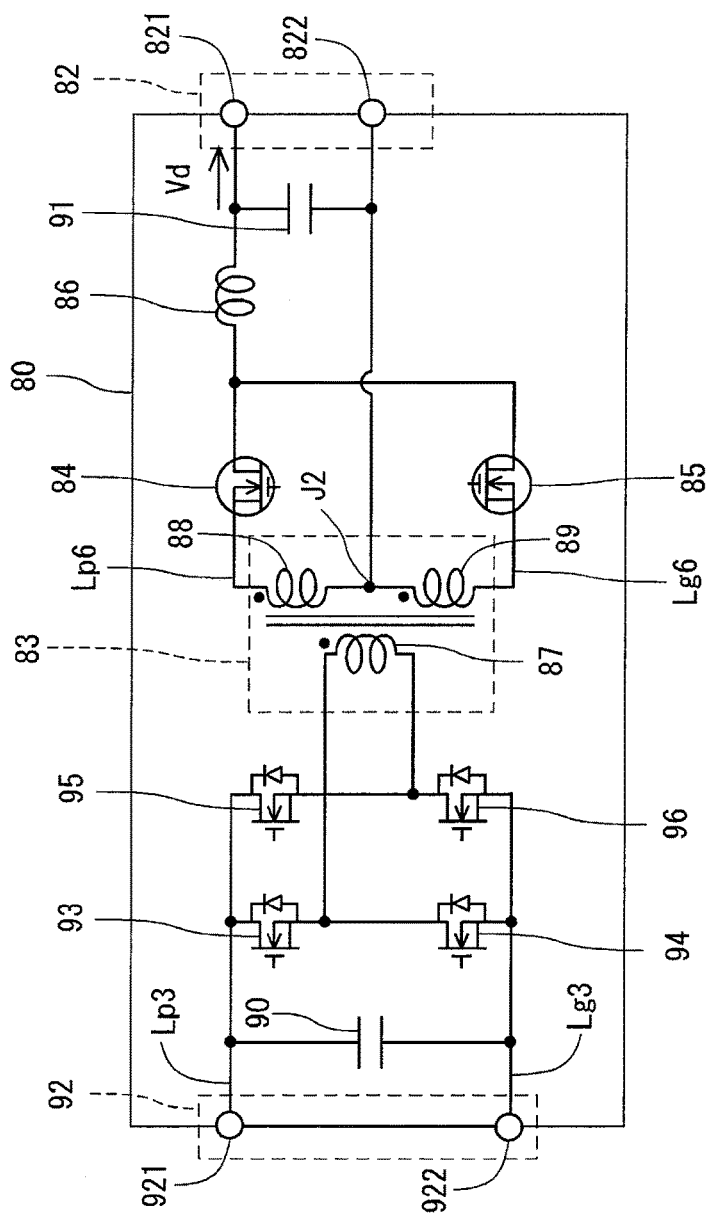
FIG. 3 is an equivalent circuit diagram of a DC-to-DC converter of the power conversion apparatus according to the first embodiment.

As shown in FIG. 3, the DDC 80 is a full-bridge type DC-to-DC converter. The DDC 80 includes a case connection terminal 92, a converter output terminal 82, switching elements 93 to 96, a transformer 83, synchronous rectifier elements 84, 85, a reactor 86, and smoothing capacitors 90, 91.

The case connection terminal 92 includes a first case connection terminal 921 and a second case connection terminal 922. The case connection terminal 92 is connected to the converter input terminal 81 of the case 40.

The converter output terminal 82 includes a first converter output terminal 821 and a second converter output terminal 822. The converter output terminal 82 is connected to the auxiliary devices of the vehicle, such as lamps and a radio.

The switching elements 93 to 96 are disposed on two pairs of high- and low-potential lines, and form a full-bridge circuit. The switching element 93 and the switching element 95 are connected to a high potential line Lp3. The switching element 94 and the switching element 96 are connected to a low-potential line Lg3.

The switching elements 93 and 96, which are on one diagonal line of the full-bridge circuit, and the switching elements 94 and 95, which are on another diagonal line of the full-bridge circuit, are alternately turned on and off at high speed, so positive voltage and negative voltage are alternately applied to a primary coil 87 of the transformer 83.

The transformer 83 converts the voltage between the primary side connected to the case connection terminal 92 and the secondary side connected to the converter output terminal 82. The transformer 83 includes the primary coil 87 and the secondary coils 88, 89. When the positive voltage and the negative voltage are alternately applied to the primary coil 87, the voltages are generated in the secondary coils 88, 89, and thus the voltage is converted.

The synchronous rectifier elements 84, 85 are, for example, provided by MOSFETs. The synchronous rectifier element 84 is connected to the secondary coil 88. The synchronous rectifier element 85 is connected to the secondary coil 89. Since the synchronous rectifier elements 84, 85 are alternately turned on and off, the current on the secondary side is synchronously rectified.

The reactor 86 can store and discharge the magnetic energy caused by the induced voltage generated in accordance with the change in current.

The smoothing capacitor 90 smoothes the voltage between the first case connection terminal 921 and the second case connection terminal 922. The smoothing capacitor 91 smoothes the voltage between the first converter output terminal 821 and the second converter output terminal 822.

(Operations)

Next, operations of the power conversion apparatus 101 will be described.

The battery voltage Vb, which is for example at 100 to 300 V, is applied to the inverter input terminal 41 from the battery 20. When the battery voltage Vb is applied, the boost converter 30 steps up the battery voltage Vb to a level of approximately 900 V to thereby generate the boosted voltage Vs. When the boosted voltage Vs is applied to the inverters 24, 25, the inverters 24, 25 convert, during power running, the DC voltage into three-phase AC voltage and supply the three-phase AC voltage to the MGs 26, 27. The inverters 24, 25 covert, during regenerative running, the AC current generated by the MGs 26, 27 into the DC current, so that the DC current can be charged in the battery 20.

When the battery voltage Vb is applied, the DDC 80 steps down the battery voltage Vb to a level of 10 to 20 V in accordance with the high speed switching operations of the switching elements 93 to 96 of the full-bridge circuit to thereby generate the bucked voltage Vd. The bucked voltage Vd is supplied to the auxiliary devices such as the lamps and the radio of the vehicle. At this time, a radio noise occurs because a radiation noise caused by the common mode noise flowing in the wirings is superimposed on a radio antenna. Since the radio noise is generated, it was difficult to make the DDC 80 higher frequency. Further, it was thus difficult to reduce the size of the DDC 80.

In order to suppress the radio noise and reduce the size of the DDC 80, the arrangements of the inverter input terminal 41 and the converter input terminal 81 of the case 40 are devised in the following manner. Specifically, as shown in FIG. 4, the inverter input terminal 41 and the converter input terminal 81 of the case 40 are arranged on opposite sides with respect to an imaginary plane Sv, which bisects the case 40.

Hereinafter, the case 40 will be described in detail.

Figure 4:
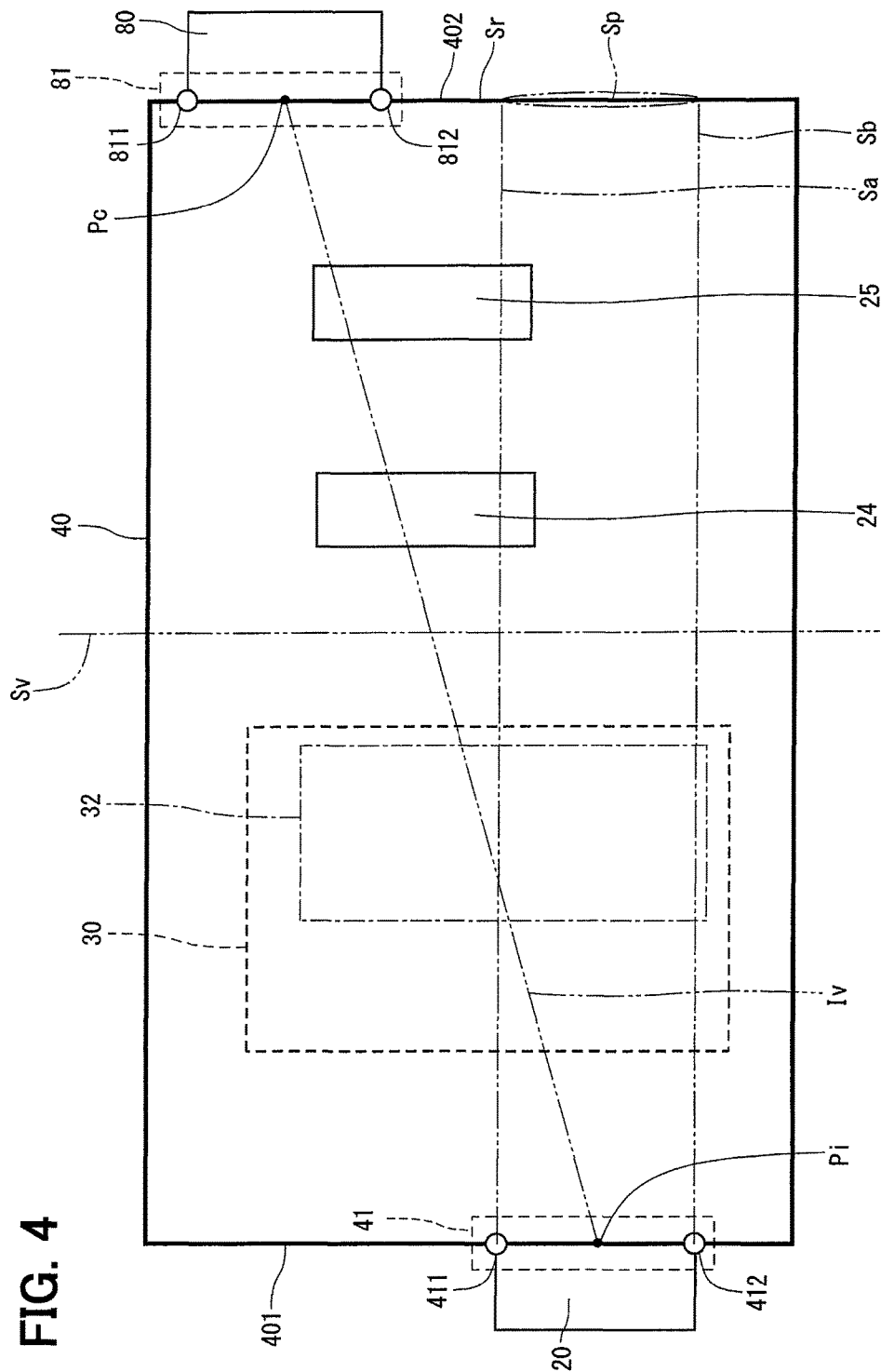
FIG. 4 is an explanatory top view of a case of the power conversion apparatus for explaining arrangements of components according to the first embodiment.

As shown in FIG. 4, the case 40 has a rectangular parallelepiped shape. The case 40 has a three-dimensional shape that has a polygonal shape in cross-section taken in a height direction. The case 40 has plural walls surrounding from six directions. The plural walls of the case 40 include a reference wall 401 and an opposed wall 402. The case 40 has the inverter input terminal 41 and the converter input terminal 81.

The reference wall 401 is opposed to the opposed wall 402. The reference wall 401 is opposed to the opposed wall 402 in a direction perpendicular to the imaginary plane Sv. The direction perpendicular to the imaginary plane Sv will be hereinafter referred to as the opposing direction.

The opposed wall 402 includes an area Sp to which the inverter input terminal 41 is projected in the opposing direction. That is, the area Sp overlap with the inverter input terminal 41 when the inverter input terminal 41 is projected onto the opposed wall 402 in the opposing direction. The area Sp is a projection area that is defined by an imaginary plane Sa that extends from the first inverter input terminal 411 to the opposed wall 402, an imaginary plane Sb that extends from the second inverter input terminal 412 to the opposed wall 402, and a plane of the opposed wall 402. On the opposed wall 402, the area of the wall surface other than the area Sp will be referred to as a remaining area Sr.

The imaginary plane Sv bisects the case 40 between the reference wall 401 and the opposed wall 402 in a longitudinal direction of the case 40, which corresponds to the opposing direction. The imaginary plane Sv is an imaginary plane that bisects the outermost of the projected plane when the case 40 is projected in six directions. The opposed wall 402 is located opposite to the reference wall 401 with respect to the imaginary plane Sv.

In the case where the case 40 has the rectangular parallelepiped shape, the case 40 has six walls and surrounds the inverters 24, 25 from six directions. Among the six walls, the adjoining walls are perpendicular to each other. The imaginary plane Sv bisects the case 40 in the longitudinal direction. In other words, the reference wall 401 and the opposed wall 402 are opposed to each other in the longitudinal direction, and the distance between the reference wall 401 and the opposed wall 402 is the longest in the distances between the other pairs of the opposed walls of the rectangular parallelepiped shape.

The inverter input terminal 41 is connected to the battery 20. The inverter input terminal 41 includes the first inverter input terminal 411 and the second inverter input terminal 412. The power line from the battery 20 is connected to the inverter input terminal 41. Thus, the inverter input terminal 41 inputs the voltage to the inverters 24, 25 via the boost converter 30.

The converter input terminal 81 is connected to the case connection terminal 92 of the DDC 80. The converter input terminal 81 includes the first converter input terminal 811 and the second converter input terminal 812. The converter input terminal 81 is connected to the power line connecting to the DDC 80. The converter input terminal 81 input the voltage that has passed through the noise filter 60 to the DDC 80.

The inverter input terminal 41 and the converter input terminal 81 are located opposite to each other with respect to the imaginary plane Sv. The inverter input terminal 41 is disposed on the reference wall 401. The converter input terminal 81 is disposed on the opposed wall 402. On the opposed wall 402, the converter input terminal 81 is located in the remaining area Sr of the opposed wall 402, which is outside of the area Sp.

The middle point of the inverter input terminal 41 is defined as Pi, and the middle point of the converter input terminal 81 is defined as Pc. An imaginary line passing through the middle point Pi and the middle point Pc is defined as Iv. The middle point Pi and the middle point Pc are located on opposite sides with respect to the imaginary plane Sv. The middle point Pi is adjoined to the reference wall 401. The middle point Pc is adjoined to the opposed wall 402. The inverters 24, 25 are located on the imaginary line Iv, within the case 40.

(Effects)

(1) In the present embodiment, the inverter input terminal 41 and the converter input terminal 81 are arranged on opposite sides of the case 40 with respect to the imaginary plane Sv. The inverter input terminal 41 is disposed on the reference wall 401, and the converter input terminal 81 is disposed on the opposed wall 402. In such a configuration, the inductance or the capacitance in the power conversion apparatus 101 is utilized between the inverter input terminal 41 and the converter input terminal 81.

Since the inductance or the capacitance is utilized, the impedance inside of the power conversion apparatus 101 is increased, and the radiation noise caused by the common mode current can be suppressed. Since the radiation noise can be suppressed, the radio noise is suppressed, and the switching frequency of the DDC 80 can be increased to a higher frequency. Since the DDC 80 can be made to have a higher frequency, the size of the DDC 80 can be reduced.

(2) Since the inverters 24, 25 are located on the imaginary line Iv, the inductance or the capacitance parasitic on the inverter can be used, and the impedance inside of the power conversion apparatus 101 increases. Therefore, the radiation noise caused by the common mode noise is further suppressed.

Second Embodiment

In a second embodiment, the structure of a power conversion apparatus 102 is similar to the structure of the power conversion apparatus 101 of the first embodiment, except for the shape of the walls of the case.

As shown in FIG. 5, a case 42 of the power conversion apparatus 102 includes a reference wall 403 and an adjoining wall 404 that adjoins to the reference wall 403 through the common edge Ec, which is one of edges of the rectangular parallelepiped shape.

Figure 6A:
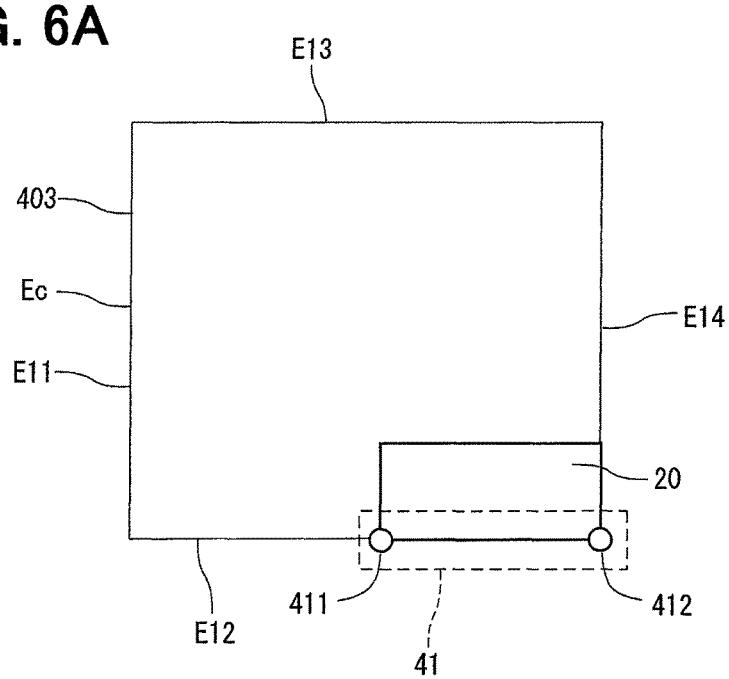
FIG. 6A is an explanatory side view of the case at a line VIA-VIA in FIG. 5 when viewed along arrows VIA.
Figure 6B:
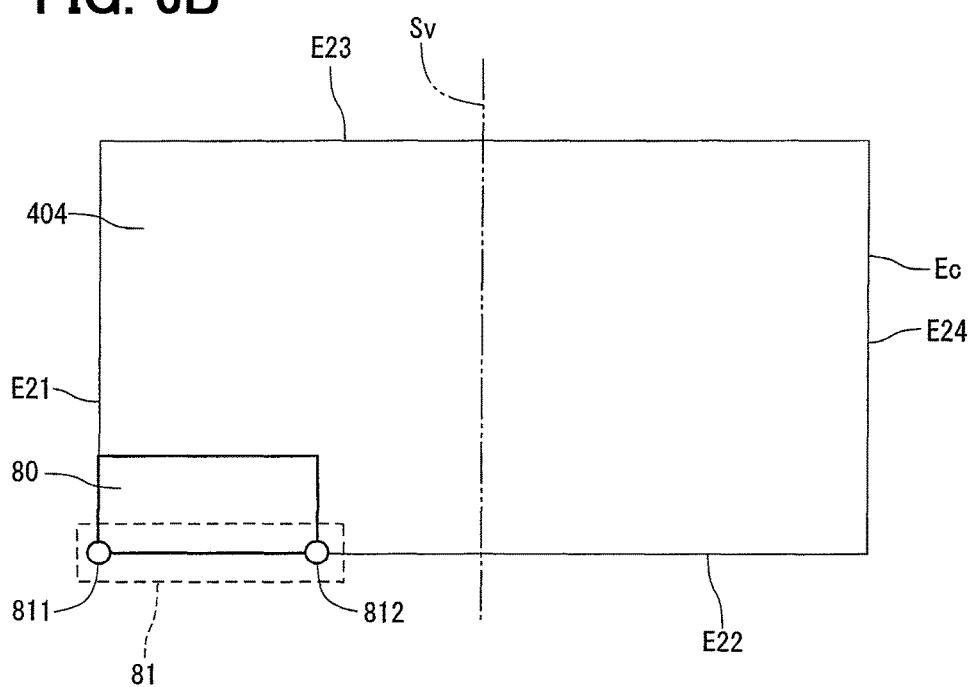
FIG. 6B is an explanatory side view of the case at a line VIB-VIB in FIG. 5 when viewed along arrows VIB.

As shown in FIG. 6A, the reference wall 403 has an outline that is defined by plural edges E11 to E14. The edge E11 is opposite to the edge E14. The edge E12 is opposite to the edge E13. As shown in FIG. 6B, the adjoining wall 404 has an outline that is defined by plural edges E21 to E24. The edge E21 is opposite to the edge E24. The edge E22 is opposite to the edge E23. The edge E11 and the edge E24 correspond to the common edge Ec at which the reference wall 403 and the adjoining wall 404 adjoin to each other.

The inverter input terminal 41 is disposed on the reference wall 403 at a position adjacent to the edge E14 that is the furthest from the common edge Ec. The converter input terminal 81 is disposed on the adjoining wall 404 at a position adjacent to the edge E21 that is the furthest from the common edge Ec. Also in the second embodiment, the advantageous effects similar to the first embodiment can be achieved.

Third Embodiment

Figure 7:
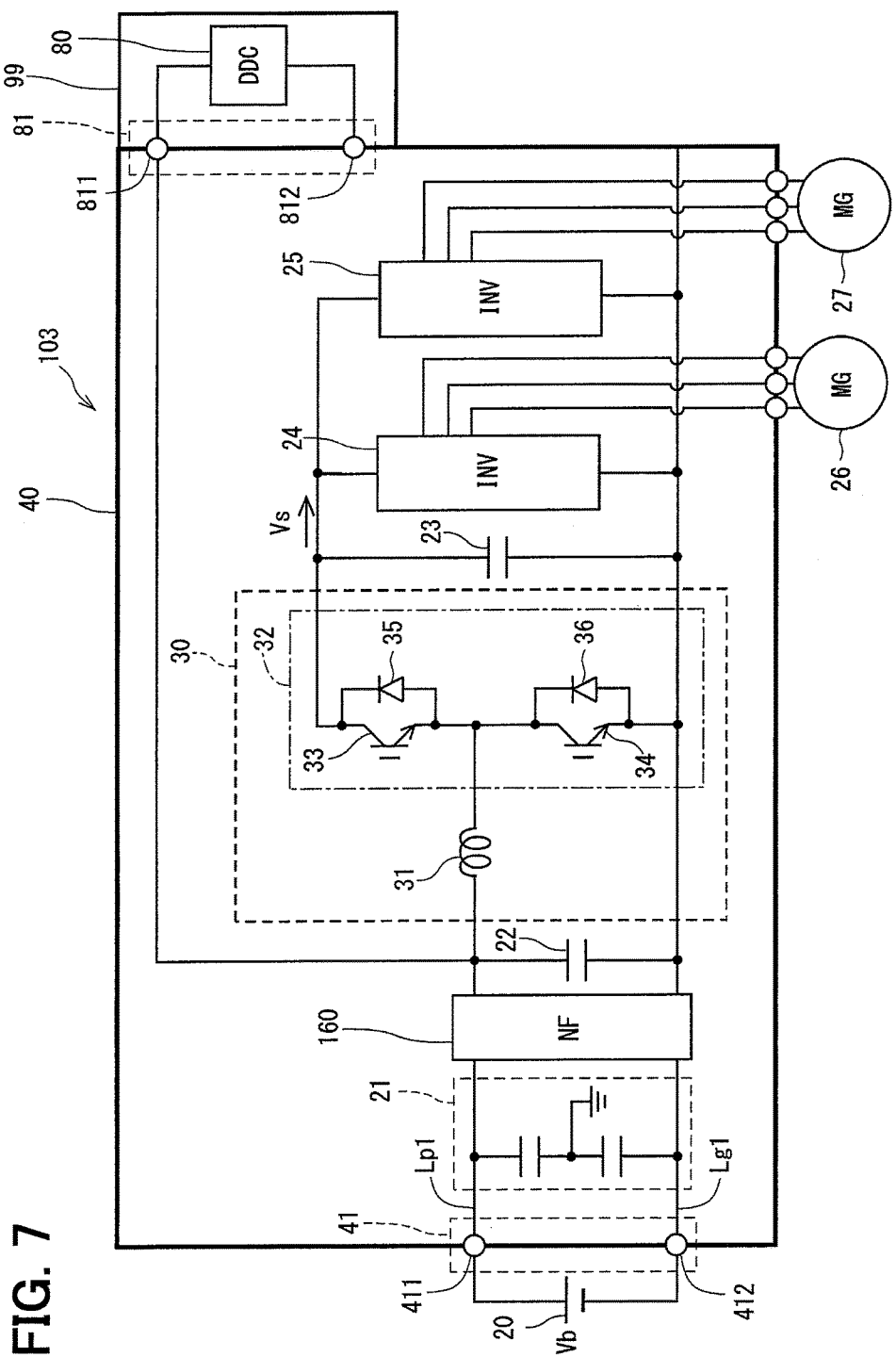
FIG. 7 is an equivalent circuit diagram of a power conversion apparatus according to a third embodiment of the present disclosure.

In a third embodiment, the structure of a power conversion apparatus 103 is similar to the structure of the power conversion apparatus 101 of the first embodiment, except for the arrangement of the noise filter. As shown in FIG. 7, a noise filter 160 of the power conversion apparatus 103 is juxtaposed between the common mode capacitor 21 and the filter capacitor 22. Also in the structure where the distance from the inverter input terminal 41 to the noise filter 160 is short, the advantageous effects similar to those of the first embodiment can be achieved.

Fourth Embodiment

In a fourth embodiment, the structure of a power conversion apparatus 104 is similar to the structure of the power conversion apparatus 101 of the first embodiment, except for the arrangements of the filter capacitor and the boost converter.

Figure 8:
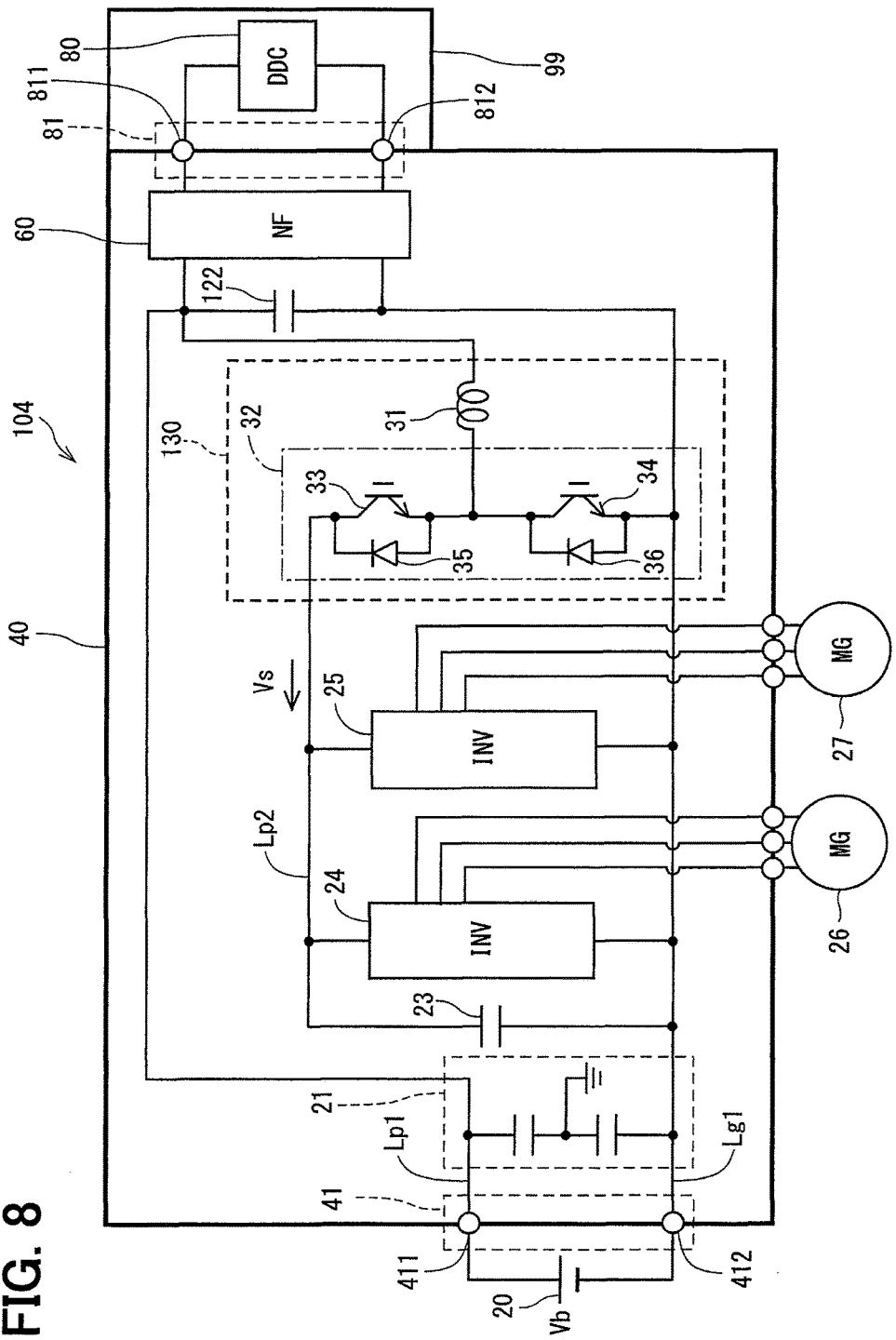
FIG. 8 is an equivalent circuit diagram of a power conversion apparatus according to a fourth embodiment of the present disclosure.

As shown in FIG. 8, in the power conversion apparatus 104, a filter capacitor 122 is disposed between a boost converter 130 and a noise filter 60, on a side adjacent to the converter input terminal 81 than the inverter input terminal 41, and is juxtaposed with the noise filter 60.

The boost converter 130 is disposed between the inverters 24, 25 and the filter capacitor 122, on the side adjacent to the converter input terminal 81 than the inverter input terminal 41. The filter capacitor 122 is distant from the inverter input terminal 41. The boost converter 130 is distant from the inverter input terminal 41. Also in the fourth embodiment, the advantageous effects similar to those of the first embodiment can be achieved.

Fifth Embodiment

In a fifth embodiment, the structure of a power conversion apparatus 105 is similar to the structure of the power conversion apparatus 101 of the first embodiment, except for the arrangement of the filter capacitor.

Figure 9:
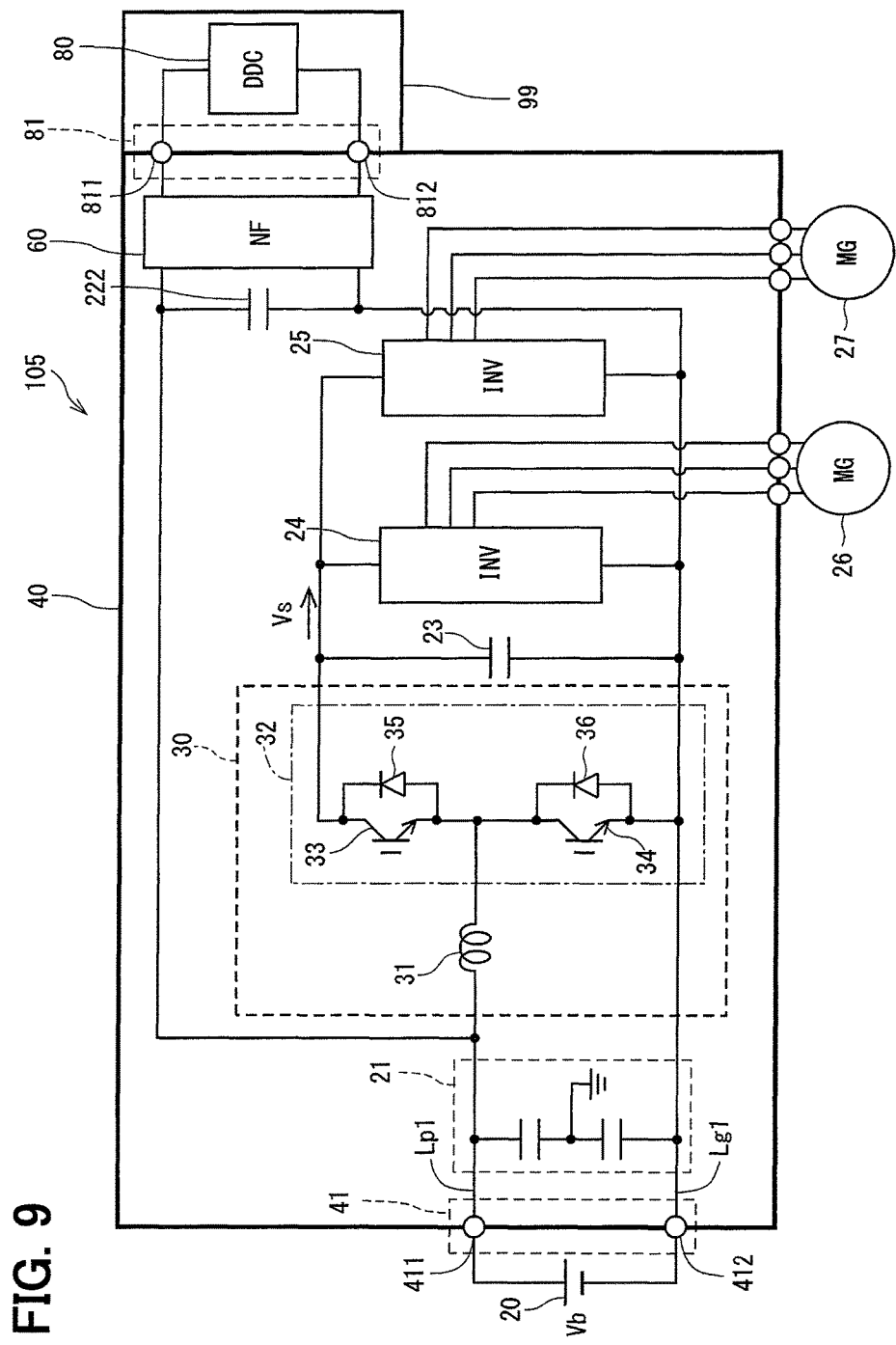
FIG. 9 is an equivalent circuit diagram of a power conversion apparatus according to a fifth embodiment of the present disclosure.

As shown in FIG. 9, a filter capacitor 222 of the power conversion apparatus 105 is arranged between the inverters 24, 25 and the noise filter 60, and is juxtaposed with the noise filter 60. Also in this arrangement, even when the filter capacitor 122 is distant from the inverter input terminal 41, the advantageous effects similar to those of the first embodiment can be achieved.

Sixth Embodiment

In a sixth embodiment, the structure of a power conversion apparatus 106 is similar to the structure of the power conversion apparatus 101 of the first embodiment, except for the wiring path from the inverter input terminal 41 to the converter input terminal 81.

Figure 10:
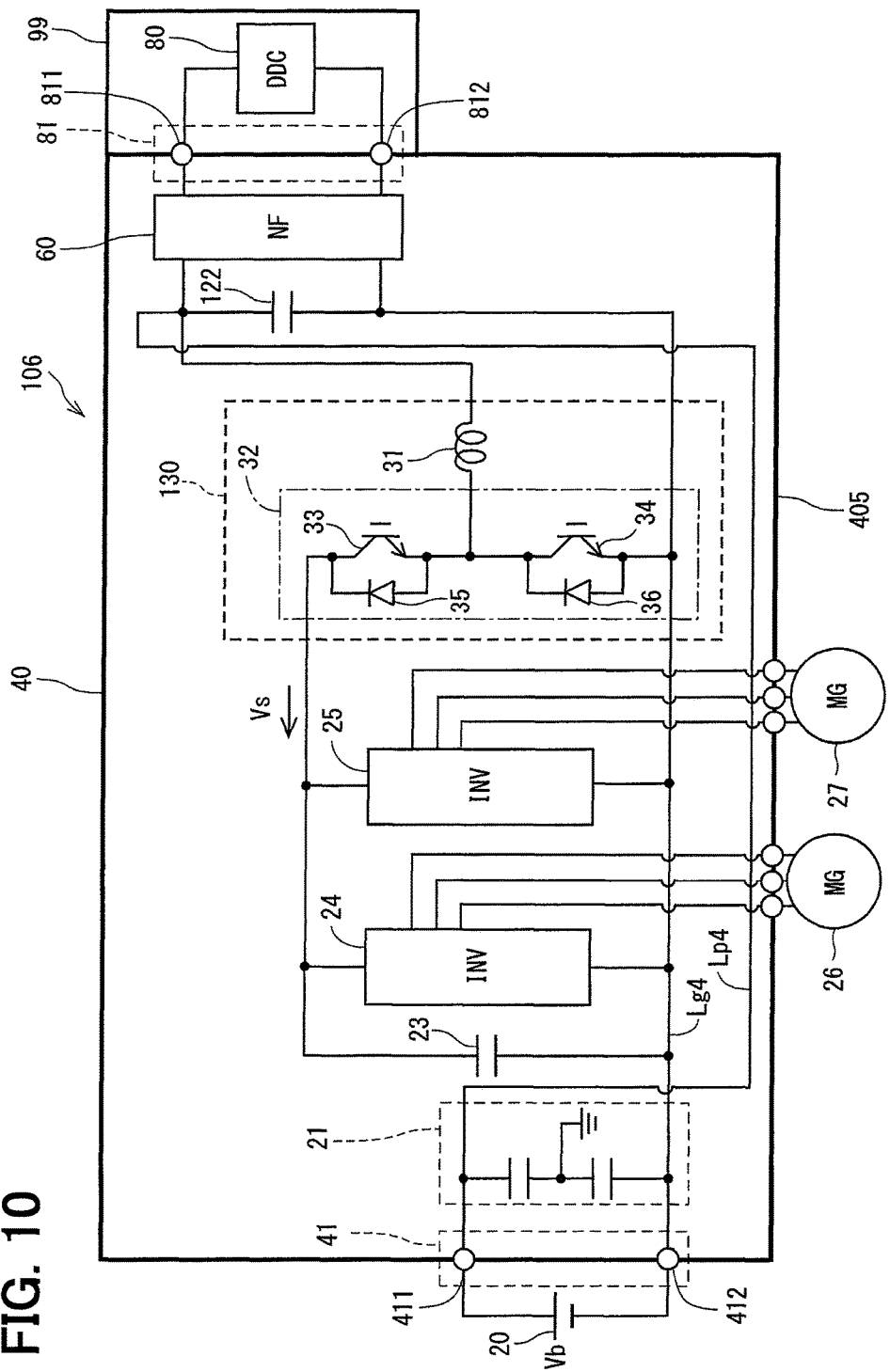
FIG. 10 is an equivalent circuit diagram of a power conversion apparatus according to a sixth embodiment of the present disclosure.

As shown in FIG. 10, in the power conversion apparatus 106, a high potential line Lp4 from the first inverter input terminal 411 to the noise filter 60 and a low potential line Lg 4 from the second inverter input terminal 412 to the noise filter 60 are each directly connected through a single conductive wire. The high potential line Lp4 from the first inverter input terminal 411 to the input terminal of the noise filter 60, and the low potential line Lg 4 from the output terminal of the noise filter 60 to the second inverter input terminal 412 are extended along the wall 405 of the case 40. Also in the sixth embodiment, the advantageous effects similar to those of the first embodiment can be achieved.

Seventh Embodiment

In a seventh embodiment, the structure of a power conversion apparatus 107 is similar to the structure of the power conversion apparatus 105 of the fifth embodiment, except for the wiring path from the inverter input terminal 41 to the converter input terminal 81.

Figure 11:
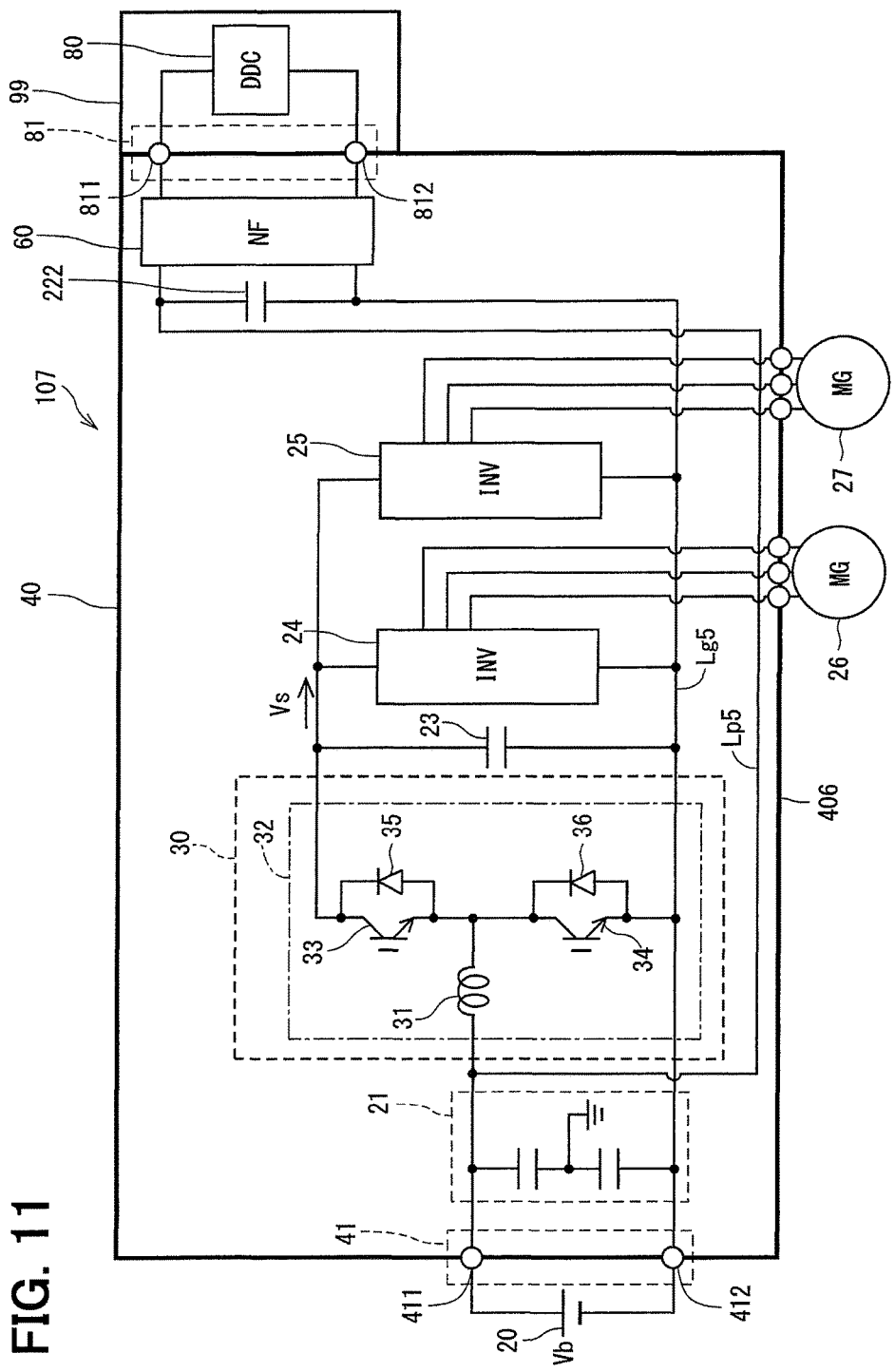
FIG. 11 is an equivalent circuit diagram of a power conversion apparatus according to a seventh embodiment of the present disclosure.

As shown in FIG. 11, a high potential line Lp5 from the first inverter input terminal 411 to the filter capacitor 222 and a low potential line Lg5 are directly connected through a single conductive wire. The high potential line Lp5 from the first inverter input terminal 411 to the input terminal of the filter capacitor 222 and the low potential line Lg5 from the output terminal of the filter capacitor 222 to the second inverter input terminal 412 are extended along the wall 406 of the case 40. Also in the seventh embodiment, the advantageous effects similar to those of the first embodiment can be achieved.

Other Embodiments (i) In the present embodiments, the DDC is the bucking converter that bucks the voltage applied from the battery. As another example, the DDC may have a function of a boost converter that steps up the voltage applied from the battery. Also in such a case, the advantageous effects similar to the first embodiment may be achieved.

(ii) As shown in FIG. 12, the DDC 80 may be accommodated in the case 40. Likewise, the battery 20 may be accommodated in the case. Also in such cases, the advantageous effects similar to the first embodiment can be achieved.

(iii) The power conversion apparatus may have a cooling passage therein that allows a cooling medium such as a cooling water and a cooling gas to flow for cooling the inverter or the DDC.

(iv) The DDC may have a push-pull type DC-to-DC converter. Irrespective of the type of the DC-to-DC converter, the advantageous effects similar to those of the first embodiment can be achieved.

(v) It is not always necessary that the case has the rectangular parallelepiped shape that is surrounded by walls in six directions. The case may have a columnar shape with a bottom wall having a polygonal shape such as a step shape or a trapezoidal shape, or any other columnar shape having a curved wall such as a semicircular columnar shape with a semicircular shaped bottom wall and a columnar shape with a fun shaped bottom wall.

While only the selected exemplary embodiment and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

What is claimed is:
1. A power conversion apparatus comprising:
an inverter that converts a DC voltage supplied from a battery into an AC voltage;
a DC-to-DC converter that steps up or down the DC voltage supplied from the battery; and
a case that includes a plurality of walls surrounding the inverter, an inverter input terminal to which a power line from the battery is connected so as to input the DC voltage to the inverter, and a converter input terminal to which a power line connecting to the DC-to-DC con- verter is connected so as to input the DC voltage to the DC-to-DC converter, wherein the plurality of walls includes a reference wall and an opposed wall that is opposed to the reference wall, the inverter input terminal is disposed adjacent to the reference wall with respect to an imaginary plane that bisects the case between the reference wall and the opposed wall, and the converter input terminal is disposed adjacent to the opposed wall with respect to the imaginary plane.

2. The power conversion apparatus according to claim 1, wherein the inverter input terminal is disposed adjacent to one wall among the plurality of walls, and the converter input terminal is disposed adjacent to another wall among the plurality of walls.

3. The power conversion apparatus according to claim 1, wherein the inverter input terminal is disposed on the reference wall, and the converter input terminal is disposed on the opposed wall.

4. The power conversion apparatus according to claim 3, wherein on the opposed wall, the converter input terminal is disposed in an area outside of an area that overlaps the inverter input terminal when the inverter input terminal is projected onto the opposed wall.

5. The power conversion apparatus according to claim 1, wherein the plurality of walls includes an adjoining wall that adjoins to the reference wall through a common edge, the inverter input terminal is disposed along an edge of the reference wall, the edge being a furthest edge from the common edge in the reference wall, and the converter input terminal is disposed along an edge of the adjoining wall, the edge being a furthest edge from the common edge in the adjoining wall.

6. The power conversion apparatus according to claim 1, wherein the inverter is located on an imaginary line that passes through the inverter input terminal and the converter input terminal.

7. The power conversion apparatus according to claim 1, further comprising:

a boost converter that is disposed between the battery and the inverter, the boost converter stepping up the DC voltage supplied from the battery and outputting the DC voltage stepped up to the inverter, wherein the boost converter includes a boosting part, the boosting part includes a reactor that stores and discharges electric energy, and a switching element connected in series to the reactor, and the boosting part is located on an imaginary line that passes through the inverter input terminal and the converter input terminal.

8. The power conversion apparatus according to claim 1, wherein the case has a rectangular parallelepiped shape, and the plurality of walls surround the inverter from six directions.

9. The power conversion apparatus according to claim 8, wherein the reference wall and the opposed wall are opposed to each other in a longitudinal direction of the rectangular parallelepiped shape of the case.

10. The power conversion apparatus according to claim 5, wherein the case has a rectangular parallelepiped shape, and the plurality of walls surround the inverter from six directions.

11. The power conversion apparatus according to claim 1, further comprising:

a high-potential line and a low-potential line disposed in the case and coupling the inverter input terminal and the converter input terminal to each other, the inverter being disposed on the high-potential line and the low-potential line;

a common mode capacitor connected in parallel with the inverter through the high-potential line and the low-potential line, the common mode capacitor being disposed adjacent to the inverter input terminal in the case;

a noise filter connected in parallel with the common mode capacitor through the high-potential line and the low-potential line; and a filter capacitor connected in parallel with the common mode capacitor through the high-potential line and the low-potential line.

12. The power conversion apparatus according to claim 11, wherein the reference wall and the opposed wall are opposed to each other in a longitudinal direction of the case, the inverter input terminal is disposed on the reference wall, and the converter input terminal is disposed on the opposed wall, on the opposed wall, the converter input terminal is disposed in an area outside of an area that overlaps the inverter input terminal when the inverter input terminal is projected onto the opposed wall in the longitudinal direction of the case, and the inverter is located on an imaginary line that passes through the inverter input terminal and the converter input terminal.

* * * * *